United States Patent
Ootsubo et al.

(10) Patent No.: US 12,516,074 B2
(45) Date of Patent: Jan. 6, 2026

(54) COMPOSITION, FILM, METHOD OF FORMING FILM, METHOD OF FORMING PATTERN, METHOD OF FORMING ORGANIC-UNDERLAYER-FILM REVERSE PATTERN, AND METHOD OF PRODUCING COMPOSITION

(71) Applicant: JSR CORPORATION, Tokyo (JP)

(72) Inventors: Yuusuke Ootsubo, Tokyo (JP); Ryuichi Serizawa, Tokyo (JP); Kazunori Sakai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 966 days.

(21) Appl. No.: 17/696,982

(22) Filed: Mar. 17, 2022

(65) Prior Publication Data
US 2022/0204535 A1    Jun. 30, 2022

Related U.S. Application Data

(63) Continuation of application No. PCT/JP2020/036358, filed on Sep. 25, 2020.

(30) Foreign Application Priority Data

Sep. 27, 2019 (JP) ................. 2019-177719

(51) Int. Cl.
| | |
|---|---|
| *G03F 7/11* | (2006.01) |
| *C07F 7/28* | (2006.01) |
| *C07F 15/04* | (2006.01) |
| *C07F 15/06* | (2006.01) |
| *G03F 7/09* | (2006.01) |
| *G03F 7/20* | (2006.01) |
| *G03F 7/039* | (2006.01) |
| *G03F 7/40* | (2006.01) |

(52) U.S. Cl.
CPC ............. *C07F 7/28* (2013.01); *C07F 15/04* (2013.01); *C07F 15/06* (2013.01); *G03F 7/094* (2013.01); *G03F 7/2004* (2013.01); *G03F 7/039* (2013.01); *G03F 7/11* (2013.01); *G03F 7/20* (2013.01); *G03F 7/40* (2013.01)

(58) Field of Classification Search
CPC .. C07F 7/28; C07F 15/04; C07F 15/06; G03F 7/094; G03F 7/200404
See application file for complete search history.

(56) References Cited

U.S. PATENT DOCUMENTS

| | | | |
|---|---|---|---|
| 10,090,163 B2 | 10/2018 | Nakagawa et al. | |
| 2014/0193975 A1* | 7/2014 | Ogihara | G03F 7/091 |
| | | | 438/702 |
| 2015/0284539 A1* | 10/2015 | Kurita | G03F 7/091 |
| | | | 106/287.19 |
| 2015/0364332 A1* | 12/2015 | Nakagawa | G03F 7/094 |
| | | | 106/287.18 |

FOREIGN PATENT DOCUMENTS

| | | |
|---|---|---|
| JP | H11-258813 A | 9/1999 |
| JP | 2014134592 A | 7/2014 |
| JP | 2015199916 A | 11/2015 |
| KR | 1020150114900 A | 10/2015 |
| KR | 1020150135238 A | 12/2015 |
| WO | WO-2014156374 A1 | 10/2014 |

OTHER PUBLICATIONS

Office Action issued Sep. 12, 2023 in Japanese Patent Application No. 2021-549062 (with English translation), 8 pages.
International Search Report issued Dec. 15, 2020 in PCT/JP2020/036358 (with English translation), 5 pages.
Written Opinion issued Dec. 15, 2020 in PCT/JP2020/036358 (with English translation), 6 pages.
Office Action issued Nov. 25, 2024, in corresponding Korean Patent Application No. 10-2022-7009642 (with machine English translation), 13 pages.

* cited by examiner

*Primary Examiner* — Mark F. Huff
*Assistant Examiner* — Richard David Champion
(74) *Attorney, Agent, or Firm* — Element IP, PLC

(57) ABSTRACT

A composition includes: a metal compound including a ligand; and a solvent. The ligand is derived from a compound represented by formula (1). L represents an oxygen atom or a single bond; $R^1$ represents a substituted or unsubstituted monovalent hydrocarbon group having 1 to 10 carbon atoms; $R^2$ and $R^3$ each independently represent a hydrogen atom or a substituted or unsubstituted monovalent hydrocarbon group having 1 to 10 carbon atoms, or $R^2$ and $R^3$ bind with each other and represent an alicyclic structure having 3 to 20 ring atoms together with the carbon atom to which $R^2$ and $R^3$ bond, or $R^1$ and either $R^2$ or $R^3$ bind with each other and represent a lactone ring structure having 4 to 20 ring atoms or a cyclic ketone structure having 4 to 20 ring atoms together with the atom chain to which $R^1$ and either $R^2$ or $R^3$ bond.

(1)

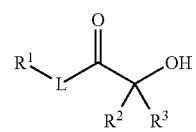

19 Claims, No Drawings

COMPOSITION, FILM, METHOD OF FORMING FILM, METHOD OF FORMING PATTERN, METHOD OF FORMING ORGANIC-UNDERLAYER-FILM REVERSE PATTERN, AND METHOD OF PRODUCING COMPOSITION

CROSS-REFERENCE TO RELATED APPLICATIONS

The present application is a continuation application of International Application No. PCT/JP2020/036358, filed Sep. 25, 2020, which claims priority to Japanese Patent Application No. 2019-177719 filed Sep. 27, 2019, the contents of which are incorporated herein by reference in their entirety.

BACKGROUND OF THE INVENTION

Field of the Invention

The present invention relates to a composition, a film, a method of forming a film, a method of forming a pattern, a method of forming an organic-underlayer-film reverse pattern, and a method of producing a composition.

Description of the Related Art

In manufacturing elements for semiconductors and the like, using a hydrolytic condensation product of a metal alkoxide has been known (see Japanese Unexamined Patent Application, Publication No. 2014-134592).

SUMMARY OF THE INVENTION

According to an aspect of the present invention, a composition includes: a metal compound including a ligand; and a solvent. The ligand is derived from a compound represented by formula (1).

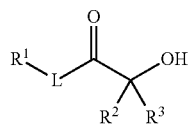

(1)

In the formula (1), L represents an oxygen atom or a single bond; $R^1$ represents a substituted or unsubstituted monovalent hydrocarbon group having 1 to 10 carbon atoms; $R^2$ and $R^3$ each independently represent a hydrogen atom or a substituted or unsubstituted monovalent hydrocarbon group having 1 to 10 carbon atoms, or $R^2$ and $R^3$ bind with each other and represent an alicyclic structure having 3 to 20 ring atoms together with the carbon atom to which $R^2$ and $R^3$ bond, or $R^1$ and either $R^2$ or $R^3$ bind with each other and represent a lactone ring structure having 4 to 20 ring atoms or a cyclic ketone structure having 4 to 20 ring atoms together with the atom chain to which $R^1$ and either $R^2$ or $R^3$ bond.

According to another aspect of the present invention, a film is formed from the above-mentioned composition.

According to a further aspect of the present invention, a method of forming a pattern includes applying the above-mentioned composition directly or indirectly on a substrate to form a resist underlayer film. An organic-resist-film-forming composition is applied directly or indirectly on the resist underlayer film to form an organic resist film. The organic resist film is exposed to a radioactive ray. The organic resist film exposed is developed.

According to a further aspect of the present invention, a method of forming an organic-underlayer-film reverse pattern includes forming an organic underlayer film directly or indirectly on a substrate. A resist pattern is formed directly or indirectly on the organic underlayer film. An organic-underlayer-film pattern is formed by etching the organic underlayer using the resist pattern as a mask. An organic-underlayer-film-reverse-pattern-forming film is formed on the organic-underlayer-film pattern by applying an organic-underlayer-film-reverse-pattern-forming composition. The organic-underlayer-film pattern is removed to form an organic-underlayer-film reverse pattern. The organic-underlayer-film-reverse-pattern-forming composition includes: a metal compound including a ligand; and a solvent. The ligand is derived from a compound represented by formula (1).

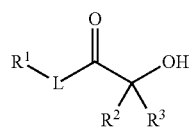

(1)

In the formula (1), L represents an oxygen atom or a single bond; $R^1$ represents a substituted or unsubstituted monovalent hydrocarbon group having 1 to 10 carbon atoms; $R^2$ and $R^3$ each independently represent a hydrogen atom or a substituted or unsubstituted monovalent hydrocarbon group having 1 to 10 carbon atoms, or $R^2$ and $R^3$ bind with each other and represent an alicyclic structure having 3 to 20 ring atoms together with the carbon atom to which $R^2$ and $R^3$ bond, or $R^1$ and either $R^2$ or $R^3$ bind with each other and represent a lactone ring structure having 4 to 20 ring atoms or a cyclic ketone structure having 4 to 20 ring atoms together with the atom chain to which $R^1$ and either $R^2$ or $R^3$ bond.

According to a further aspect of the present invention, a method of producing a composition includes: mixing a metal alkoxide and a compound represented by formula (1) to obtain a mixture; and adding water to the mixture.

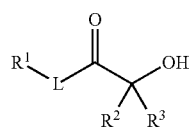

(1)

In the formula (1), L represents an oxygen atom or a single bond; $R^1$ represents a substituted or unsubstituted monovalent hydrocarbon group having 1 to 10 carbon atoms; $R^2$ and $R^3$ each independently represent a hydrogen atom or a substituted or unsubstituted monovalent hydrocarbon group having 1 to 10 carbon atoms, or $R^2$ and $R^3$ bind with each other and represent an alicyclic structure having 3 to 20 ring atoms together with the carbon atom to which $R^2$ and $R^3$ bond, or $R^1$ and either $R^2$ or $R^3$ bind with each other and represent a lactone ring structure having 4 to 20 ring atoms or a cyclic ketone structure having 4 to 20 ring atoms together with the atom chain to which $R^1$ and either $R^2$ or $R^3$ bond.

DESCRIPTION OF EMBODIMENTS

One embodiment of the invention is a composition containing: a metal compound (hereinafter, may be also referred to as "(A) compound" or "compound (A)") having a ligand (hereinafter, may be also referred to as "ligand (a)"); and a solvent (hereinafter, may be also referred to as "(C) solvent" or "solvent (C)"), wherein the ligand is derived from a compound (hereinafter, may be also referred to as "(X) compound" or "compound (X)") represented by the following formula (1).

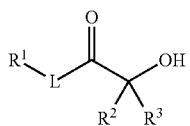

(1)

wherein, in the formula (1), L represents an oxygen atom or a single bond; $R^1$ represents a substituted or unsubstituted monovalent hydrocarbon group having 1 to 10 carbon atoms; $R^2$ and $R^3$ each independently represent a hydrogen atom or a substituted or unsubstituted monovalent hydrocarbon group having 1 to 10 carbon atoms, or $R^2$ and $R^3$ bind with each other and represent an alicyclic structure having 3 to 20 ring atoms together with the carbon atom to which $R^2$ and $R^3$ bond, or $R^1$ and either $R^2$ or $R^3$ bind with each other and represent a lactone ring structure having 4 to 20 ring atoms or a cyclic ketone structure having 4 to 20 ring atoms together with the atom chain to which $R^1$ and either $R^2$ or $R^3$ bond.

An other embodiment of the invention is a film formed from the composition of the one embodiment of the invention.

A still another embodiment of the invention is a method of forming a film, the method including applying a film-forming composition directly or indirectly on a substrate.

A yet another embodiment of the invention is a method of forming a pattern, the method including: applying a resist-underlayer-film-forming composition directly or indirectly on a substrate; applying an organic-resist-film-forming composition directly or indirectly on a resist underlayer film formed by the applying of the resist-underlayer-film-forming composition; exposing to a radioactive ray, an organic resist film formed by the applying of the organic-resist-film-forming composition; and developing the organic resist film exposed.

A further embodiment of the invention is a method of forming an organic-underlayer-film reverse pattern, the method including: forming an organic underlayer film directly or indirectly on a substrate; forming a resist pattern directly or indirectly on the organic underlayer film; forming an organic-underlayer-film pattern by etching the organic underlayer film using the resist pattern as a mask; forming an organic-underlayer-film-reverse-pattern-forming film on the organic-underlayer-film pattern by using an organic-underlayer-film-reverse-pattern-forming composition; and forming an organic-underlayer-film reverse pattern by removing the organic-underlayer-film pattern.

A yet further embodiment of the invention is a method of producing a composition, the method including: mixing a metal alkoxide and the compound (X); and adding water to a mixture obtained by the mixing.

According to the present invention, a composition being superior in storage stability and an embedding property, a film, a method of forming a film, a method of forming a pattern, a method of forming an organic-underlayer-film reverse pattern, and a method of producing a composition can be provided.

Hereinafter, the present invention will be described in the order of: the composition; the method of producing the composition; the film; the method of forming the film; the method of forming a pattern; and the method of forming an organic-underlayer-film reverse pattern.

Composition

The composition of one embodiment of the present invention contains the compound (A) and the solvent (C). The composition may contain other optional component(s) aside from the compound (A) and the solvent (C), within a range not leading to impairment of the effects of the present invention.

Due to containing the compound (A) and the solvent (C), the composition is superior in storage stability. Furthermore, the composition is capable of forming a film superior in the embedding property. Although not necessarily clarified and without wishing to be bound by any theory, the reason for achieving the effects described above by the composition due to involving such a constitution may be presumed, for example, as in the following. It is considered that in the compound (A), coordination of the ligand derived from the compound (X) to a metal atom constituting the metal compound improves the storage stability and the embedding property.

Furthermore, the composition enables forming a film that is superior in a coating-film-thickness-variation-inhibiting property, resistance to etching by an oxygen-based gas, removability, a resist pattern collapse-inhibiting property, and solubility in an organic solvent.

Since the composition achieves the effects described above, it can be suitably used as a composition for use in forming a resist underlayer film. By using the composition for such intended usage, the embedding property in embedding the resist underlayer film formed from the composition into gaps of the pattern can be superior. Furthermore, the resist underlayer film formed from the composition is superior in the coating-film-thickness-variation-inhibiting property, etching resistance and removability. Moreover, since the resist underlayer film formed from the composition is superior in the solubility in an organic solvent, easy removal from the substrate in an edge-back rinse step is enabled.

The composition can be suitably used also as a composition for organic-underlayer-film reverse pattern formation. By using the composition for such intended usage, a superior embedding property in forming the organic-underlayer-film reverse pattern is achieved. Moreover, the organic-underlayer-film reverse pattern formed from the composition is superior in the coating-film-thickness (pattern thickness)-variation-inhibiting property, the etching resistance, and the removability.

Each component contained in the composition will be described below.

(A) Compound

The compound (A) is a metal compound having the ligand (a). The compound (A) can be obtained by, for example, a reaction of a metal compound (hereinafter, may be also referred to as "compound (M)") having a hydrolyzable group, and the compound (X) described later.

A metal atom in the compound (M) is exemplified by metal atoms which are exemplified as a metal atom in the compound (A) as described later.

The hydrolyzable group included in the compound (M) is exemplified by a halogen atom, an alkoxy group, an acyloxy group, and the like.

Examples of the halogen atom include a fluorine atom, a chlorine atom, a bromine atom, an iodine atom, and the like.

Examples of the alkoxy group include a methoxy group, an ethoxy group, an n-propoxy group, an isopropoxy group, a butoxy group, and the like.

Examples of the acyloxy group include a formyloxy group, an acetoxy group, a propionyloxy group, an n-butyryloxy group, a t-butyryloxy group, a t-amyloxy group, an n-hexanecarbonyloxy group, an n-octanecarbonyloxy group, and the like.

The compound (M) is exemplified by a metal alkoxide, a hydrolytic condensation product of a metal alkoxide, or a mixture of the same, a metal halide, and the like. It is to be noted that the "hydrolytic condensation" as referred to means a reaction in which an alkoxy group contained in the metal alkoxide is hydrolyzed to give a hydroxy group, and two hydroxy groups undergo dehydrative condensation to form an ether bond.

The metal atom in the compound (A) is exemplified by an atom of an element belonging to period 3 to period 7 of group 2 to group 14 in the periodic table. It is to be noted that in the following, the atom of the element belonging to a certain group (X group) in the periodic table is merely referred to as the "metal atom belonging to group X". The compound (A) may have one, or two or more types of the metal atom.

Examples of the metal atom belonging to group 2 include a magnesium atom, a calcium atom, a strontium atom, a barium atom, and the like;
  examples of the metal atom belonging to group 3 include lanthanoids such as a scandium atom, an yttrium atom, and a lanthanum atom, actinoids such as an actinium atom, and the like;
  examples of the metal atom belonging to group 4 include a titanium atom, a zirconium atom, a hafnium atom, and the like;
  examples of the metal atom belonging to group 5 include a vanadium atom, a niobium atom, a tantalum atom, and the like;
  examples of the metal atom belonging to group 6 include a chromium atom, a molybdenum atom, a tungsten atom, and the like;
  examples of the metal atom belonging to group 7 include a manganese atom, a rhenium atom, and the like;
  examples of the metal atom belonging to group 8 include an iron atom, a ruthenium atom, an osmium atom, and the like;
  examples of the metal atom belonging to group 9 include a cobalt atom, a rhodium atom, an iridium atom, and the like;
  examples of the metal atom belonging to group 10 include a nickel atom, a palladium atom, a platinum atom, and the like;
  examples of the metal atom belonging to group 11 include a copper atom, a silver atom, and a gold atom;
  examples of the metal atom belonging to group 12 include a zinc atom, a cadmium atom, a mercury atom, and the like;
  examples of the metal atom belonging to group 13 include an aluminum atom, a gallium atom, an indium atom, a thallium atom, and the like;
  examples of the metal atom belonging to group 14 include a tin atom, a lead atom, and the like.

Of these, the metal atom in the compound (A) is preferably a metal atom belonging to group 4, 9, or 10 in the periodic table, and more preferably a titanium atom, a zirconium atom, a cobalt atom, or a nickel atom.

Examples of the compound (M) include:
  titanium-containing compounds such as diisopropoxybis(2,4-pentanedionato) titanium(IV), tetra-n-butoxy titanium(IV), tetra-n-propoxy titanium(IV), tetraisopropoxy titanium(IV), tri-n-butoxymonostearate titanium(IV), a titanium(IV) butoxide oligomer, aminopropyltrimethoxy titanium(IV), triethoxymono(2,4-pentanedionato) titanium(IV), tri-n-propoxymono(2,4-pentanedionato) titanium(IV), triisopropoxymono(2,4-pentanedionato) titanium, and di-n-butoxybis(2,4-pentanedionato) titanium(IV);
  zirconium-containing compounds such as dibutoxybis(ethylacetoacetate) zirconium(IV), di-n-butoxybis(2,4-pentanedionato) zirconium(IV), tetra-n-butoxy zirconium(IV), tetra-n-propoxy zirconium(IV), tetraisopropoxy zirconium(IV), aminopropyltriethoxy zirconium(IV), 2-(3,4-epoxycyclohexyl)ethyltrimethoxy zirconium(IV), γ-glycidoxypropyltrimethoxy zirconium(IV), 3-isocyanopropyltrimethoxy zirconium(IV), triethoxymono(2,4-pentanedionato) zirconium(IV), tri-n-propoxymono(2,4-pentanedionato) zirconium(IV), triisopropoxymono(2,4-pentanedionato) zirconium(IV), tri(3-methacryloxypropyl) methoxy zirconium(IV), and tri(3-acryloxypropyl) methoxy zirconium(IV);
  hafnium-containing compounds such as diisopropoxybis(2,4-pentanedionato) hafnium(IV), tetrabutoxy hafnium(IV), tetraisopropoxy hafnium(IV), and tetraethoxy hafnium(IV);
  tantalum-containing compounds such as tetrabutoxy tantalum(IV), pentabutoxy tantalum(V), and pentaethoxy tantalum(V);
  tungsten-containing compounds such as tetrabutoxy tungsten(IV), pentabutoxy tungsten(V), pentamethoxy tungsten(V), hexabutoxy tungsten(VI), and hexaethoxy tungsten(VI);
  iron-containing compounds such as iron chloride(III);
  ruthenium-containing compounds such as diacetato[(S)-(−)-2,2'-bis(diphenylphosphino)-1,1'-binaphthyl] ruthenium(II);
  cobalt-containing compounds such as cobalt(II) acetate tetrahydrate and dichloro[ethylenebis(diphenylphosphine)] cobalt(II);
  nickel-containing compounds such as nickel(II) acetate tetrahydrate;
  zinc-containing compounds such as diisopropoxy zinc(II) and zinc(II) acetate;
  aluminum-containing compounds such as triisopropoxy aluminum (III), diisopropoxyethylacetoacetate aluminum(III), and aluminum(III) acetate;
  indium-containing compounds such as indium(III) acetate and triisopropoxy indium(III);
  tin-containing compounds such as tetraethyldiacetoxy stannoxane, tetrabutoxy tin(IV), tetraisopropoxy tin (IV), and t-butyltris(diethylamide) tin(IV); and
  germanium-containing compounds such as tetraisopropoxy germanium(IV).

The compound (M) is preferably tetraisopropoxy titanium (IV), tetra-n-propoxy zirconium(IV), cobalt(II) acetate tetrahydrate, or nickel(II) acetate tetrahydrate.

The lower limit of a proportion of the compound (A) contained in the composition is preferably 1% by mass. The upper limit of the proportion is preferably 20% by mass.

Ligand (a)

The ligand (a) is a ligand derived from a compound (compound (X)") represented by the following formula (1). The compound (A) may have one, or two or more types of the ligand (a).

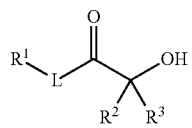

(1)

In the above formula (1), L represents an oxygen atom or a single bond; $R^1$ represents a substituted or unsubstituted monovalent hydrocarbon group having 1 to 10 carbon atoms; $R^2$ and $R^3$ each independently represent a hydrogen atom or a substituted or unsubstituted monovalent hydrocarbon group having 1 to 10 carbon atoms, or $R^2$ and $R^3$ bind with each other and represent an alicyclic structure having 3 to 20 ring atoms together with the carbon atom to which $R^2$ and $R^3$ bond, or $R^1$ and either $R^2$ or $R^3$ bind with each other and represent a lactone ring structure having 4 to 20 ring atoms or a cyclic ketone structure having 4 to 20 ring atoms together with the atom chain to which $R^1$ and either $R^2$ or $R^3$ bond.

As referred to herein, the "hydrocarbon group" is exemplified by a chain hydrocarbon group, an alicyclic hydrocarbon group, and an aromatic hydrocarbon group. Exemplary "hydrocarbon group" involves a saturated hydrocarbon group and an unsaturated hydrocarbon group. The "chain hydrocarbon group" as referred to herein means a hydrocarbon group not having a cyclic structure but being constituted with only a chain structure, and both a linear chain hydrocarbon group and a branched chain hydrocarbon group may be involved. The "alicyclic hydrocarbon group" as referred to herein means a hydrocarbon group that includes, as a ring structure, not an aromatic ring structure but an alicyclic structure alone, and both a monocyclic alicyclic hydrocarbon group and a polycyclic alicyclic hydrocarbon group may be involved. However, it is not necessary for the alicyclic hydrocarbon group to be constituted with only an alicyclic structure, and a part thereof may have a chain structure. The "aromatic hydrocarbon group" as referred to herein means a hydrocarbon group that includes an aromatic ring structure as a ring structure. However, it is not necessary for the aromatic hydrocarbon group to be constituted with only an aromatic ring structure, and a part thereof may have an alicyclic structure and/or a chain structure.

The monovalent hydrocarbon group having 1 to 10 carbon atoms is exemplified by a monovalent chain hydrocarbon group having 1 to 10 carbon atoms, a monovalent alicyclic hydrocarbon group having 3 to 10 carbon atoms, a monovalent aromatic hydrocarbon group having 6 to 10 carbon atoms, a group obtained by combining the same, and the like.

Examples of the monovalent chain hydrocarbon group having 1 to 10 carbon atoms include: alkyl groups such as a methyl group, an ethyl group, an n-propyl group, an isopropyl group, an n-butyl group, a sec-butyl group, and a tert-butyl group; alkenyl groups such as an ethenyl group, a propenyl group, and a butenyl group; alkynyl groups such as an ethynyl group, a propynyl group, and a butynyl group; and the like.

Examples of the monovalent alicyclic hydrocarbon group having 3 to 10 carbon atoms include cycloalkyl groups such as a cyclopentyl group and a cyclohexyl group; cycloalkenyl groups such as a cyclopropenyl group, a cyclopentenyl group, and a cyclohexenyl group; bridged cyclic saturated hydrocarbon groups such as a norbornyl group and an adamantyl group; bridged cyclic unsaturated hydrocarbon groups such as a norbornenyl group; and the like.

Examples of the monovalent aromatic hydrocarbon group having 6 to 10 carbon atoms include a phenyl group, a tolyl group, a naphthyl group, and the like.

Examples of the alicyclic structure having 3 to 20 ring atoms which may be represented by $R^2$ and $R^3$ through binding with each other, together with the carbon atom to which $R^2$ and $R^3$ bond include: monocyclic saturated alicyclic structures such as a cyclopropane structure, a cyclobutane structure, a cyclopentane structure, and a cyclohexane structure; polycyclic saturated alicyclic structures such as a norbornane structure and an adamantane structure; monocyclic unsaturated alicyclic structures such as a cyclopropene structure, a cyclobutene structure, a cyclopentene structure, and a cyclohexene structure; polycyclic unsaturated alicyclic structures such as a norbornene structure; and the like.

Examples of the lactone ring structure having 4 to 20 ring atoms which may be represented by $R^1$ and either $R^2$ or $R^3$ through binding with each other, together with the atom chain to which $R^1$ and either $R^2$ or $R^3$ bond include a butyrolactone structure, a valerolactone structure, a mevalonic lactone structure, a norbornanelactone structure, and the like. It is to be noted that in a case in which $R^1$ and either $R^2$ or $R^3$ bind with each other and represent the lactone ring structure together with the atom chain to which $R^1$ and either $R^2$ or $R^3$ bond, L represents an oxygen atom.

Examples of the cyclic ketone structure having 4 to 20 ring atoms which may be represented by $R^1$ and either $R^2$ or $R^3$ through binding with each other, together with the atom chain to which $R^1$ and either $R^2$ or $R^3$ bond include a cyclopentanone structure, a cyclohexanone structure, a cycloheptanone structure, a cyclopentenone structure, a cyclohexenone structure, and the like. It is to be noted that in the case in which $R^1$ and either $R^2$ or $R^3$ bind with each other and represent the cyclic ketone structure together with the atom chain to which $R^1$ and either $R^2$ or $R^3$ bond, L represents a single bond.

A substituent which may be included in the monovalent hydrocarbon group having 1 to 10 carbon atoms is exemplified by a hydroxy group, a halogen atom, an alkoxy group, a nitro group, a cyano group, a carboxy group, and the like. It is preferred that the monovalent hydrocarbon group having 1 to 10 carbon atoms does not have the substituent.

In the case in which $R^1$ and either $R^2$ or $R^3$ do not bind with each other and do not represent the lactone ring structure having 4 to 20 ring atoms or the cyclic ketone structure together with the atom chain to which $R^1$ and either $R^2$ or $R^3$ bond, L represents preferably a single bond. In this case, the storage stability of the composition can be further improved.

In the case in which $R^1$ and either $R^2$ or $R^3$ bind with each other and represent the lactone ring structure having 4 to 20 ring atoms or the cyclic ketone structure having 4 to 20 ring atoms, together with the atom chain to which $R^1$ and either $R^2$ or $R^3$ bond, L represents preferably an oxygen atom.

$R^1$ represents preferably a substituted or unsubstituted monovalent chain hydrocarbon group having 1 to 10 carbon atoms or a substituted or unsubstituted monovalent aromatic hydrocarbon group having 6 to 10 carbon atoms, more preferably a substituted or unsubstituted monovalent chain hydrocarbon group having 1 to 10 carbon atoms, and still more preferably an unsubstituted monovalent chain hydrocarbon group having 1 to 10 carbon atoms.

$R^2$ and $R^3$ each represent preferably a hydrogen atom, a substituted or unsubstituted monovalent chain hydrocarbon group having 1 to 10 carbon atoms, or a substituted or unsubstituted monovalent aromatic hydrocarbon group having 6 to 10 carbon atoms, more preferably a hydrogen atom, an unsubstituted monovalent chain hydrocarbon group having 1 to 10 carbon atoms or an unsubstituted monovalent aromatic hydrocarbon group having 6 to 10 carbon atoms, and still more preferably a hydrogen atom.

Alternatively, in the case in which $R^2$ and $R^3$ bind with each other and represent the alicyclic structure having 3 to 20 ring atoms together with the carbon atom to which $R^2$ and $R^3$ bond, such an alicyclic structure is preferably the monocyclic saturated alicyclic structure, and more preferably the cyclohexane structure.

Alternatively, in the case in which $R^1$ and either $R^2$ or $R^3$ bind with each other and represent the lactone ring structure or the cyclic ketone structure having 4 to 20 ring atoms, together with the atom chain to which $R^1$ and either $R^2$ or $R^3$ bond, $R^1$ and either $R^2$ or $R^3$ preferably constitute the lactone ring structure, and more preferably a butyrolactone structure. In this case, of $R^2$ and $R^3$, the one which does not constitute the ring through binding to $R^1$ represents preferably a hydrogen atom.

The compound (X) is exemplified by compounds (hereinafter, may be also referred to as "compounds (X-1) to (X-11)") represented by the following formulae (X-1) to (X-11), and the like.

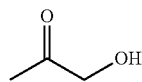
(X-1)

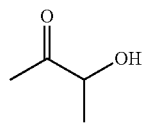
(X-2)

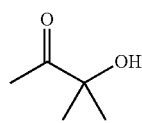
(X-3)

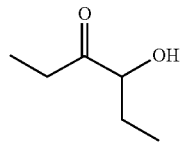
(X-4)

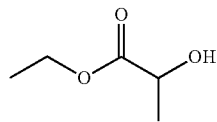
(X-5)

-continued

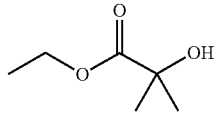
(X-6)

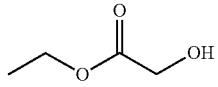
(X-7)

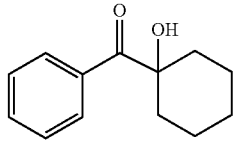
(X-8)

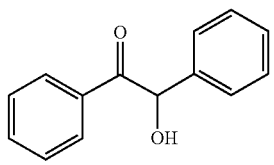
(X-9)

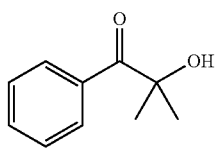
(X-10)

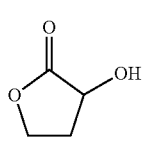
(X-11)

The lower limit of a content of the compound (X) with respect to 1 mol of the compound (M) is preferably 0.3 mol, more preferably 0.5 mol, and still more preferably 1.0 mol. The upper limit of the content with respect to 1 mol of the compound (M) is preferably 10.0 mol, more preferably 7.0 mol, and still more preferably 6.0 mol. When the content of the compound (X) falls within the above range, storage stability can be further improved.

(C) Solvent

The solvent (C) is a solvent other than the compound (X). The solvent (C) may be used also as (B) solvent in the method of producing the composition described later.

The solvent (C) is exemplified by an organic solvent. Exemplary organic solvents involve an alcohol solvent, a ketone solvent, an ether solvent, an ester solvent, a nitrogen-containing solvent, and the like. The organic solvent (C) may be used either alone of one type, or in combination of two or more types thereof.

Examples of the alcohol solvent include: monohydric alcohol solvents such as methanol, ethanol, isopropanol, and n-propanol; polyhydric alcohol solvents such as ethylene glycol and 1,2-propylene glycol; and the like.

Examples of the ketone solvent include: chain ketone solvents such as methyl ethyl ketone and methyl isobutyl ketone; cyclic ketone solvents such as cyclohexanone; and the like.

Examples of the ether solvent include: polyhydric alcohol ether solvents, e.g., chain ether solvents such as n-butyl ether, and cyclic ether solvents such as tetrahydrofuran and 1,4-dioxane; polyhydric alcohol partial ether solvents such as propylene glycol monoethyl ether; and the like.

Examples of the ester solvent include carbonate solvents such as diethyl carbonate; mono ester acetate solvents such as methyl acetate and ethyl acetate; lactone solvents such as γ-butyrolactone; polyhydric alcohol partial ether carboxylate solvents such as diethylene glycol monomethyl ether acetate and propylene glycol monomethyl ether acetate; lactic acid ester solvents such as methyl lactate and ethyl lactate; and the like.

Examples of the nitrogen-containing solvent include: chain nitrogen-containing solvents such as N,N-dimethylacetamide; cyclic nitrogen-containing solvents such as N-methylpyrrolidone; and the like.

The solvent (C) is preferably the ether solvent, more preferably the polyhydric alcohol partial ether solvent, and still more preferably propylene glycol monoethyl ether.

The lower limit of a proportion of the solvent (C) contained in the composition with respect to total components contained in the composition is preferably 10% by mass, more preferably 15% by mass, and still more preferably 20% by mass. The upper limit of the proportion with respect to total components contained in the composition is preferably 99% by mass, and more preferably 95% by mass.

Other Optional Component(s)

Other optional component(s) aside from the compound (A) and the solvent (C) may be exemplified by an acid generating agent, a surfactant, and/or the like. In a case in which the composition contains the other optional component(s), a content of the other optional component(s) in the composition may be appropriately determined within a range not leading to impairment of the effects of the present invention, in accordance with a type of the optional component(s) used.

Method of Producing Composition

The method of producing a composition of a further embodiment of the present invention includes: a step (mixing step) of mixing a metal alkoxide and the compound (X); and a step (water-adding step) of adding water to a mixture obtained by the mixing step.

According to the method of producing a composition, the composition, being superior in the storage stability, can be produced.

The method of producing a composition may further include after the mixing step, a step (hereinafter, may be also referred to as "diluting step") of diluting with a solvent (hereinafter, may be also referred to as "(B) solvent" or "solvent (B)"), the mixture obtained by the mixing step. In the case in which the method of producing a composition includes the diluting step, water is added in the water-adding step, to the mixture obtained by the diluting step.

The method of producing a composition may further include: a step (hereinafter, may be also referred to as "solvent-adding step") of adding the solvent (C) to the mixture obtained by the water-adding step; and a step (hereinafter, may be also referred to as "solvent-eliminating step") of eliminating excess water and the excess solvent (B) from the mixture obtained by the solvent-adding step.

In addition, the method of producing a composition may further include after the solvent-eliminating step, a step (hereinafter, may be also referred to as "solvent-re-adding step") of adding the solvent (C) to the mixture obtained by the solvent-eliminating step.

Each step included in the method of producing a composition will be described in detail below.

Mixing Step

In this step, the metal alkoxide and the compound (X) are mixed. Specifically, for example, the metal alkoxide and the compound (X) are added dropwise over a predetermined time period and then heated at a predetermined temperature, followed by cooling to no greater than 30° C. The predetermined time period may be appropriately set. For example, the lower limit of the predetermined time period for the dropwise addition is preferably 10 min, and more preferably 20 min. On the other hand, the upper limit of the predetermined time period for the dropwise addition is preferably 60 min, and more preferably 40 min. The predetermined temperature may be appropriately set. For example, the lower limit of the predetermined heating temperature is preferably 45° C., and more preferably 50° C. On the other hand, the upper limit of the predetermined heating temperature is preferably 75° C., and more preferably 70° C.

In regard to the metal alkoxide and compound (X), a description has been provided in the above section "Composition".

Diluting Step

In this step, the mixture obtained by the mixing step is diluted with the solvent (B) such that the compound (M) reaches a predetermined concentration.

The solvent (B) is not particularly limited as long as it is capable of dissolving or dispersing the compound (M) and the other component(s), which is/are contained as needed. The solvent (B) is exemplified by solvents similar to those exemplified in the above section "(C) Solvent" in the "Composition" described above, and the like. The solvent (B) may be used either alone of one type, or in a combination of two or more types thereof.

The solvent (B) is preferably the alcohol solvent, and more preferably isopropanol or n-propanol.

Water-Adding Step

In this step, water is added to the mixture obtained by the mixing step or to the mixture obtained by the diluting step. Specifically, for example, water is added dropwise at room temperature (25° C. to 30° C.) over a predetermined time period while stirring the mixture. The predetermined time period for the dropwise addition may be appropriately set. For example, the lower limit of the predetermined time period for dropwise addition is preferably 5 min, and more preferably 10 min. On the other hand, the upper limit of the predetermined time period for dropwise addition is preferably 40 min, and more preferably 30 min.

When water is added to the compound, a hydrolytic condensation reaction of the metal alkoxide is caused. In accordance with an advancement situation of the hydrolytic condensation reaction of the metal alkoxide, heating may be conducted after the water-adding. By the heating, the hydrolytic condensation reaction of the metal alkoxide can be promoted. In the case of conducting the heating, a heating temperature may be appropriately set. The lower limit of the heating temperature is preferably 45° C., and more preferably 50° C. The upper limit of the heating temperature is preferably 75° C., and more preferably 70° C. In the case of conducting the heating, a heating time period may be appropriately set. The lower limit of the heating time period is preferably 60 min, and more preferably 90 min. The upper limit of the time period is preferably 180 min, and more preferably 150 min.

Solvent-Adding Step

In this step, the solvent (C) is added to the mixture obtained by the water-adding step. In regard to the solvent (C), a description has been provided in the above section "Composition".

Solvent-Eliminating Step

In this step, the excess water and the excess solvent (B) are eliminated from the mixture obtained by the water-adding step. In order to eliminate the excess water and the excess solvent (B), for example, a rotary evaporator can be used. By filtrating the mixture obtained by the solvent-eliminating step through, for example, a filter having a pore size of no greater than 0.2 μm, a mixture (hereinafter, may be also referred to as "(Z) mixture" or "mixture (Z)") can be prepared. The mixture (Z) may be used directly as the composition of the one embodiment of the present invention, or a mixture obtained by the solvent-re-adding step, described below, may be used as the composition of the one embodiment of the present invention.

Solvent-Re-Adding Step

In this step, after the solvent-eliminating step, the solvent (C) is added to the mixture (Z) obtained by the solvent-eliminating step. By this step, a concentration of the compound (A) in the mixture (Z) can be adjusted.

Film

The film according to the other embodiment of the present invention is a metal-containing film formed from the composition described above. The film is superior in the embedding property. Furthermore, the film is also superior in the coating-film-thickness-variation-inhibiting property, the resistance to etching by an oxygen-based gas, the removability, the resist pattern collapse-inhibiting property, and the solubility in an organic solvent. Therefore, the film can be suitably used as a resist underlayer film.

Method of Forming Film

The method of forming a film according to the still another embodiment of the present invention includes a step (hereinafter, may be also referred to as "applying step") of applying a film-forming composition directly or indirectly on a substrate.

In the method of forming a film, the composition of the one embodiment of the present invention is used as the film-forming composition. Therefore, the method of forming a film enables a film being superior in the embedding property to be formed. Furthermore, the method of forming a film enables forming a film being superior in the coating-film-thickness-variation-inhibiting property, the resistance to etching by an oxygen-based gas, the removability, the resist pattern collapse-inhibiting property, and the solubility in an organic solvent.

The step included in the method of forming a film will be described below.

Applying Step

In this step, the film-forming composition is applied directly or indirectly on the substrate.

In this step, the composition described above is used as the film-forming composition.

A procedure for applying the film-forming composition is not particularly limited, and the applying may be carried out by an appropriate procedure such as spin-coating, cast-coating, or roll-coating. Accordingly, the coating film is formed, and occurrence of volatilization and the like of the solvent (C) results in film formation.

The substrate is exemplified by a metal substrate, a silicon wafer, and the like. The "metal substrate" refers to a substrate containing a metal atom in at least a part of a surface layer thereof. The metal atom contained in the metal substrate is not particularly limited as long as it is an atom of a metal element. Silicon and boron do not fall under the category of the metal atom. Examples of the metal atom include a copper atom, an iron atom, a zinc atom, a cobalt atom, an aluminum atom, a tin atom, a tungsten atom, a zirconium atom, a titanium atom, a tantalum atom, a germanium atom, a molybdenum atom, a ruthenium atom, a gold atom, a silver atom, a platinum atom, a palladium atom, a nickel atom, and the like. Exemplary metal substrates may include a substrate made of metal, a silicon wafer coated with metal, and the like. A silicon nitride film, an alumina film, a silicon dioxide film, a tantalum nitride film, a titanium nitride film, or the like may be formed on a part of the metal substrate.

The substrate may be either a pattern-unformed substrate, or a pattern-formed substrate.

The pattern on the pattern-formed substrate is exemplified by a line-and-space pattern or a trench pattern, with line widths of space portions being no greater than 2,000 nm, no greater than 1,000 nm, no greater than 500 nm, or no greater than 50 nm; a hole pattern, with diameters of holes being no greater than 300 nm, no greater than 150 nm, no greater than 100 nm, or no greater than 50 nm; and the like.

Furthermore, with respect to dimensions of the pattern formed on the substrate, an exemplary fine pattern may have: a height of no less than 100 nm, no less than 200 nm, or no less than 300 nm; a width of no greater than 50 nm, no greater than 40 nm, or no greater than 30 nm; and an aspect ratio (pattern height/pattern width) of no less than 3, no less than 5, or no less than 10.

It is to be noted that in the case in which the pattern-formed substrate is used as the substrate, a coating film formed by applying the film-forming composition of the one embodiment of the present invention on the substrate preferably enables recessed portions of the pattern to be filled therewith.

In this step, the coating film may be heated. The heating of the coating film may be conducted typically in an atmosphere of ambient air, or may be conducted in a nitrogen atmosphere. The lower limit of a temperature in the heating is preferably 60° C. The upper limit of the temperature is preferably 150° C. The lower limit of a time period of the heating is preferably 10 sec, and more preferably 30 sec. The upper limit of the time period is preferably 300 sec, and more preferably 180 sec.

The heating of the coating film may be conducted as a preheating, with the coating film being further heated after the preheating. This heating is typically carried out in an ambient air, but may be carried out in a nitrogen atmosphere. The lower limit of a temperature in the heating is preferably 200° C., more preferably 250° C., and still more preferably 300° C. The upper limit of the temperature is preferably 600° C., more preferably 500° C., and still more preferably 400° C. The lower limit of a time period of the heating is preferably 15 sec, and more preferably 30 sec. The upper limit of the time period is preferably 1,200 sec, and more preferably 600 sec.

In the method of forming a film, exposing may be combined with the heating. A radioactive ray to be used in the exposing may be appropriately selected, and examples of the radioactive ray include: electromagnetic waves such as a visible light ray, an ultraviolet ray, a far ultraviolet ray, an X-ray, and a γ-ray; and particle rays such as an electron beam, a molecular beam, and an ion beam.

The lower limit of an average thickness of the film to be formed is preferably 1 nm, more preferably 5 nm, and still more preferably 10 nm. The upper limit of the average thickness is preferably 1,000 nm, more preferably 500 nm, and still more preferably 100 nm. It is to be noted that the average thickness of the film is a value measured using a spectroscopic ellipsometer ("A2000D," available from J. A. Woollam Co.).

Method of Forming Pattern

The method of forming a pattern according to the yet another embodiment of the present invention includes: a step (hereinafter, may be also referred to as "resist-underlayerfilm-forming-composition-applying step") of applying a resist-underlayer-film-forming composition directly or indirectly on a substrate; a step (hereinafter, may be also referred to as "organic-resist-film-forming-composition-applying step") of applying an organic-resist-film-forming composition directly or indirectly on a resist underlayer film formed by the resist-underlayer-film-forming-composition-applying step; a step (hereinafter, may be also referred to as "exposing step") of exposing to a radioactive ray, an organic resist film formed by the organic-resist-film-forming composition-applying step; and a step (hereinafter, may be also referred to as "developing step") of developing the organic resist film exposed.

The method of forming a pattern may further include, before the resist-underlayer-film-forming-composition-applying step, a step (hereinafter, may be also referred to as "organic-underlayer-film-forming step") of forming an organic underlayer film directly or indirectly on the substrate.

The method of forming a pattern may also include, as needed, before the organic-resist-film-forming-composition-applying step, a step (hereinafter, may be also referred to as "silicon-containing-film-forming step") of forming a silicon-containing film on the resist underlayer film formed by the resist-underlayer-film-forming-composition-applying step.

The method of forming a pattern may further include, after the developing step, a step (hereinafter, may be also referred to as "etching step") of etching using as a mask, a resist pattern formed by the developing step.

In the resist-underlayer-film-forming-composition-applying step, the composition described above is used as the resist-underlayer-film-forming composition. Therefore, the method of forming a pattern enables a film being superior in the embedding property to be formed. Furthermore, the method of forming a pattern enables forming a film being superior in the coating-film-thickness-variation-inhibiting property, the resistance to etching by an oxygen-based gas, the removability, the resist pattern collapse-inhibiting property, and the solubility in an organic solvent.

Each step included in the method of forming a pattern will be described below.

Organic-Underlayer-Film-Forming Step

In this step, the organic underlayer film is formed on the substrate. By this step, the organic underlayer film is formed. The substrate is exemplified by substrates similar to those exemplified in the above section "Method of Forming Film", and the like. A procedure of forming the organic underlayer film is exemplified by procedures similar to those exemplified for the organic-underlayer-film-forming step in the method of forming an organic-underlayer-film reverse pattern of the further embodiment of the present invention as described later, and the like.

Resist-Underlayer-Film-Forming-Composition-Applying Step

In this step, the resist-underlayer-film-forming composition is applied directly or indirectly on the substrate. By this step, the resist underlayer film is formed. This step is similar to the applying step in the method of forming a film of the still another embodiment of the present invention, described above.

The case in which the resist-underlayer-film-forming composition is applied indirectly on the substrate may be exemplified by a case in which the resist-underlayer-film-forming composition is applied on the organic underlayer film formed on the substrate by the organic-underlayer-film-forming step, and the like.

Silicon-Containing-Film-Forming Step

In this step, a silicon-containing film is formed on the resist underlayer film formed by the resist-underlayer-film-forming-composition-applying step. By this step, the silicon-containing film is formed.

The silicon-containing film is formed by, for example, subjecting a coating film formed by applying a silicon-containing-film-forming composition on the resist underlayer film to, typically, exposure and/or heating, thereby allowing for hardening. As the silicon-containing-film-forming composition, for example, a commercially available product may be used, and as the commercially available product, for example, "NFC SOG01," "NFC SOG04," or "NFC SOG080" (all available from JSR Corporation), or the like may be used.

A procedure for applying the silicon-containing-film-forming composition is not particularly limited, and is exemplified by a spin-coating procedure and the like.

Examples of the radioactive ray which may be used for the exposure include: electromagnetic waves such as a visible light ray, an ultraviolet ray, a far ultraviolet ray, an X-ray, and a γ-ray; particle rays such as an electron beam, a molecular beam, and an ion beam; and the like.

The lower limit of a temperature when heating the coating film is preferably 90° C., more preferably 150° C., and still more preferably 180° C. The upper limit of the temperature is preferably 550° C., more preferably 450° C., and still more preferably 300° C.

Organic-Resist-Film-Forming-Composition-Applying Step

In this step, the organic-resist-film-forming composition is applied directly or indirectly on the resist underlayer film formed by the resist-underlayer-film-forming-composition-applying step. By this step, the organic resist film is formed.

The case in which the organic-resist-film-forming composition is applied indirectly on the resist underlayer film may be exemplified by a case in which the organic-resist-film-forming composition is applied on the silicon-containing film formed on the resist underlayer film by the silicon-containing-film-forming step, and the like.

Examples of the organic-resist-film-forming composition include: a chemically amplified positive or negative resist composition that contains a radiation-sensitive acid generating agent; a positive resist composition containing an alkali-soluble resin and a quinone diazide-based photosensitizing agent; a negative resist composition containing an alkali-soluble resin and a crosslinking agent; and the like.

The organic-resist-film-forming composition is typically used after filtering through a filter having a pore size of no greater than 0.2 for example. In this step, a commercially available product may be directly used as the organic-resist-film-forming composition.

A procedure for applying the organic-resist-film-forming composition is not particularly limited, and is exemplified by a spin-coating procedure and the like.

In this step, after applying the organic-resist-film-forming composition, it is preferred that a solvent in the coating film is volatilized by heating, whereby the organic resist film is formed. Various conditions of the heating, such as a temperature and a time period, can be appropriately adjusted in accordance with the type and/or the like of the organic-resist-film-forming composition used.

Exposing Step

In this step, the organic resist film formed by the organic-resist-film-forming composition-applying step is exposed to a radioactive ray.

The radioactive ray for use in the exposure may be appropriately selected from: electromagnetic waves such as a visible light ray, an ultraviolet ray, a far ultraviolet ray, an X-ray, and a γ-ray; particle rays such as an electron beam, a molecular beam, and an ion beam; and the like, depending on the type of the radiation-sensitive acid generating agent, quinone diazide-based photosensitizing agent, and cross-linking agent to be used in the organic-resist-film-forming composition. Among these, far ultraviolet rays are preferred; and a KrF excimer laser beam (wavelength: 248 nm), an ArF excimer laser beam (wavelength: 193 nm), an $F_2$ excimer laser beam (wavelength: 157 nm), a $Kr_2$ excimer laser beam (wavelength: 147 nm), an ArKr excimer laser beam (wavelength: 134 nm), or an extreme ultraviolet ray (EUV; wavelength: 13.5 nm, etc.) is more preferred; and a KrF excimer laser beam, an ArF excimer laser beam, or an EUV is still more preferred.

After the exposing, heating may be conducted in order to improve the resolution, pattern profile, developability, and the like. Various conditions of the heating, such as a temperature and a time period, can be appropriately adjusted in accordance with the type and/or the like of the organic resist film.

Developing Step

In this step, the organic resist film exposed is developed. By this step, the resist pattern is formed.

The development may be either a development with an alkali or a development with an organic solvent. In the case of the development with an alkali, examples of the developer solution include basic aqueous solutions of ammonia, triethanolamine, tetramethylammonium hydroxide (TMAH), tetraethylammonium hydroxide, or the like. To the basic aqueous solution, a water-soluble organic solvent, e.g., alcohols such as methanol and ethanol, a surfactant, etc., may be added, each in an appropriate amount. Alternatively, in the case of the development with an organic solvent, examples of the developer solution include the organic solvents exemplified as the solvent (C) of the composition of the one embodiment of the present invention described above, and the like.

In this step, after the development with the developer solution, washing and drying are typically performed.

Etching Step

In this step, etching is carried out using the resist pattern, which was formed by the developing step, as a mask. By this step, the patterned substrate can be obtained.

The etching may be conducted once or multiple times. In other words, the etching may be conducted sequentially using patterns obtained by the etching as masks, and in light of obtaining a pattern having a more favorable configuration, the etching is preferably conducted multiple times.

An etching procedure may be exemplified by dry etching, wet etching, and the like. Of these, in light of making the configuration of the substrate pattern more favorable, the dry etching is preferred.

The dry etching may be carried out by using, for example, a well-known dry etching apparatus. An etching gas for use in the dry etching may be appropriately selected in accordance with the mask pattern, an element composition of the film to be etched, and the like. Examples of the etching gas include: fluorine-based gases such as $CHF_3$, $CF_4$, $C_2F_6$, $C_3F_8$, and $SF_6$; chlorine-based gases such as $Cl_2$ and $BCl_3$; oxygen-based gases such as $O_2$, $O_3$, and $H_2O$; reductive gases such as $H_2$, $NH_3$, CO, $CO_2$, $CH_4$, $C_2H_2$, $C_2H_4$, $C_2H_6$, $C_3H_4$, $C_3H_6$, $C_3H_8$, HF, HI, HBr, HCl, NO, $NH_3$, and $BCl_3$; inert gases such as He, $N_2$, and Ar; and the like. These gases may be used as a mixture.

Method of Forming Organic-Underlayer-Film Reverse Pattern

The method of forming an organic-underlayer-film reverse pattern according to the further embodiment of the present invention includes: a step (hereinafter, may be also referred to as "organic-underlayer-film-forming step") of forming an organic underlayer film directly or indirectly on a substrate; a step (hereinafter, may be also referred to as "resist pattern-forming step") of forming a resist pattern directly or indirectly on the organic underlayer film; a step (hereinafter, may be also referred to as "organic-underlayer-film-pattern-forming step") of forming an organic-underlayer-film pattern by etching the organic underlayer film using the resist pattern as a mask; a step (hereinafter, may be also referred to as "organic-underlayer-film-reverse-pattern-forming-film-forming step") of forming an organic-underlayer-film-reverse-pattern-forming film on the organic-underlayer-film pattern by using an organic-underlayer-film-reverse-pattern-forming composition; and a step (hereinafter, may be also referred to as "organic-underlayer-film-reverse-pattern-forming step") of forming an organic-underlayer-film reverse pattern by removing the organic-underlayer-film pattern.

The method of forming an organic-underlayer-film reverse pattern may further include, before the resist pattern-forming step, a step (hereinafter, may be also referred to as "resist-intermediate-film-forming step") of forming a resist intermediate film on the organic underlayer film formed by the organic-underlayer-film-forming step.

The method of forming an organic-underlayer-film reverse pattern may further include a step (hereinafter, may be also referred to as "organic-underlayer-film-reverse-pattern-removing step") of removing the organic-underlayer-film reverse pattern formed by the organic-underlayer-film-reverse-pattern-forming step.

In the method of forming an organic-underlayer-film reverse pattern, the composition described above is used as the organic-underlayer-film-reverse-pattern-forming composition. Therefore, the method of forming an organic-underlayer-film reverse pattern enables the organic-underlayer-film reverse pattern being superior in the embedding property to be formed. Furthermore, the method of forming an organic-underlayer-film reverse pattern enables forming the organic-underlayer-film reverse pattern being superior in the coating-film-thickness-variation-inhibiting property, the resistance to etching by an oxygen-based gas, the removability, the resist pattern collapse-inhibiting property, and the solubility in an organic solvent.

Each step included in the method of forming an organic-underlayer-film reverse pattern will be described below.

Organic-Underlayer-Film-Forming Step

In this step, the organic underlayer film is formed directly or indirectly on the substrate. By this step, the organic underlayer film is formed.

The substrate is exemplified by substrates similar to those exemplified in the above section "Method of Forming Film", and the like.

In this step, for example, after applying the organic underlayer-film-forming composition directly or indirectly on the substrate, the organic underlayer film can be formed by heating. Various conditions of the heating, such as a temperature and a time period, can be appropriately adjusted in accordance with the type and/or the like of the organic underlayer-film-forming composition used.

As the organic underlayer-film-forming composition, a commercially available product may be used. Examples of the commercially available product include "NFC HM8006", available from JSR Corporation, and the like.

A procedure for applying the organic underlayer-film-forming composition is not particularly limited, and is exemplified by a spin-coating procedure and the like.

The lower limit of the average thickness of the organic underlayer film to be formed is preferably 10 nm, more preferably 50 nm, and still more preferably 100 nm. The upper limit of the average thickness is preferably 1,000 nm, and more preferably 500 nm. It is to be noted that the average thickness of the organic underlayer film is a value measured using a spectroscopic ellipsometer ("M2000D," available from J. A. Woollam Co.).

Resist-Intermediate-Film-Forming Step

In this step, the resist intermediate film is formed on the organic underlayer film formed by the organic-underlayer-film-forming step. Examples of the resist intermediate film include commercially available products such as: "NFC SOG01," "NFC SOG04," and "NFC SOG080," each available from JSR Corporation, and the like. Alternatively, a polysiloxane, titanium oxide, aluminum oxide, tungsten oxide, or the like that is formed by a CVD process may be used. A procedure of forming the resist intermediate film is not particularly limited, and for example, a coating procedure, a CVD process, or the like may be employed. Of these, the coating procedure is preferred. When the coating procedure is employed, the resist intermediate film may be consecutively formed after forming the organic underlayer film.

Resist Pattern-Forming Step

In this step, the resist pattern is formed directly or indirectly on the organic underlayer film. By this step, the resist pattern is formed.

The case in which the resist pattern is indirectly formed on the organic underlayer film may be exemplified by a case in which the resist pattern is formed on the resist intermediate film which was formed in the resist-intermediate-film-forming step, and the like.

A procedure of forming the resist pattern is not particularly limited, and the resist pattern can be formed by a common procedure such as a procedure of using a resist composition, or a procedure in which a nanoimprint lithography technique is employed, for example.

Organic-Underlayer-Film-Pattern-Forming Step

In this step, an organic-underlayer-film pattern is formed by etching the organic underlayer film using the resist pattern as a mask. The etching procedure may be exemplified by etching procedures similar to those exemplified for the etching step in the method of forming a pattern described above, and the like. For the dry etching of the organic underlayer film, an oxygen-based gas is suitably used. Moreover, for the dry etching of the resist intermediate film in the case of forming the resist intermediate film, a fluorine-based gas is typically used.

The organic-underlayer-film pattern thus formed is exemplified by a line-and-space pattern or a trench pattern, with line widths of space portions being no greater than 2,000 nm, no greater than 1,000 nm, no greater than 500 nm, or no greater than 50 nm; a hole pattern, with diameters of holes being no greater than 300 nm, no greater than 150 nm, no greater than 100 nm, or no greater than 50 nm; and the like.

With respect to dimensions of the organic-underlayer-film pattern, an exemplary fine pattern may have: a height of no less than 100 nm, no less than 200 nm, or no less than 300 nm; a width of no greater than 50 nm, no greater than 40 nm, or no greater than 30 nm; and an aspect ratio (pattern height/pattern width) of no less than 3, no less than 5, or no less than 10.

Organic-Underlayer-Film-Reverse-Pattern-Forming-Film-Forming Step

In this step, the organic-underlayer-film-reverse-pattern-forming film is formed on the organic-underlayer-film pattern by using the organic-underlayer-film-reverse-pattern-forming composition. More specifically, in this step, the organic-underlayer-film-reverse-pattern-forming composition is embedded into spaces (recessed parts) of the organic-underlayer-film pattern.

In this step, the composition of the one embodiment of the present invention is used as the organic-underlayer-film-reverse-pattern-forming composition.

A procedure of forming the organic-underlayer-film-reverse-pattern-forming film is exemplified by procedures of applying the organic-underlayer-film-reverse-pattern-forming composition, and the like. The applying procedure is not particularly limited, and is exemplified by a spin-coating procedure, a cast-coating procedure, a roll-coating procedure, and the like.

In this step, after the organic-underlayer-film-reverse-pattern-forming composition is embedded into the spaces of the organic-underlayer-film pattern, drying is preferably conducted. By conducting the drying, the organic solvent in the organic-underlayer-film-reverse-pattern-forming composition can be evaporated away, and thus the forming of the organic-underlayer-film-reverse-pattern-forming film can be promoted.

A drying procedure is not particularly limited, and is exemplified by baking and the like. Various conditions of the baking such as a temperature and a time period can be appropriately adjusted depending on the blend composition, etc., of the organic-underlayer-film-reverse-pattern-forming composition used. The temperature of the baking is typically 80 to 250° C., and preferably 80 to 200° C. In a case in which the temperature of the baking is 80 to 180° C., a flattening step described later, especially a flattening processing by a wet etching back procedure, can be smoothly carried out. It is to be noted that a time period of the heating is typically 10 to 300 sec, and preferably 30 to 180 sec. Furthermore, a thickness of the organic-underlayer-film-reverse-pattern-forming film to be obtained after the drying is not particularly limited, and is typically 10 to 1,000 nm, and preferably 20 to 500 nm.

Organic-Underlayer-Film-Reverse-Pattern-Forming Step

In this step, the organic-underlayer-film reverse pattern is formed by removing the organic-underlayer-film pattern. More specifically, first, the flattening processing is preferably carried out in order to expose an upper surface of the organic-underlayer-film pattern. Next, the organic-underlayer-film pattern is removed by dry etching or dissolving and removing, whereby a predetermined organic-underlayer-film reverse pattern can be formed.

This organic-underlayer-film-reverse-pattern-forming step enables forming on the substrate, a fine pattern having a high aspect ratio, which is difficult to achieve by a conventional lithography process. Accordingly, the fine pattern can be transferred to the substrate.

As a flattening procedure to be employed in the flattening processing, an etching procedure such as dry etching back or wet etching back, a CMP procedure, or the like may be employed. Of these, in light of low cost, the dry etching back in which a fluorine-based gas or the like is used, or the wet etching back is preferred. It is to be noted that processing conditions in the flattening processing are not particularly limited, and may be appropriately adjusted.

For removal of the organic-underlayer-film pattern, dry etching is preferred, and specifically, oxygen-based gas etching, ozone etching, or the like is preferably employed. For the dry etching, a well-known apparatus such as an oxygen plasma ashing apparatus or an ozone ashing apparatus may be used. It is to be noted that the etching processing conditions are not particularly limited, and may be appropriately adjusted.

A washing liquid is exemplified by organic solvents similar to those exemplified as the solvent (C) in the composition described above, and the like.

Organic-Underlayer-Film-Reverse-Pattern-Removing Step

In this step, the organic-underlayer-film reverse pattern is removed. More specifically, in this step, the organic-underlayer-film reverse pattern is removed with a removing liquid containing an acid or a base.

The removing liquid containing the acid is exemplified by: a liquid containing an acid and water; a liquid obtained by mixing an acid, hydrogen peroxide, and water; and the like. Examples of the acid include sulfuric acid, hydrofluoric acid, hydrochloric acid, phosphoric acid, and the like. More specific examples of the removing liquid containing the acid include: a liquid obtained by mixing hydrofluoric acid, and water; a liquid obtained by mixing sulfuric acid, hydrogen peroxide, and water; a liquid obtained by mixing hydrochloric acid, hydrogen peroxide, and water; and the like.

The removing liquid containing the base is exemplified by: a liquid containing a base and water; a liquid obtained by mixing a base, hydrogen peroxide, and water; and the like, and the liquid obtained by mixing a base, hydrogen peroxide, and water is preferred.

Examples of the base include sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide (TMAH), tetraethylammonium hydroxide, pyrrole, piperidine, choline, 1,8-diazabicyclo[5.4.0]-7-undecene, and 1,5-diazabicyclo[4.3.0]-5-nonene, and the like. Of these, ammonia is preferred.

The lower limit of a temperature in the removing step is preferably 20° C., more preferably 40° C., and still more preferably 50° C. The upper limit of the temperature is preferably 300° C., and more preferably 100° C.

The lower limit of a time period of the removing step is preferably 5 sec, and more preferably 30 sec. The upper limit of the time period is preferably 10 min, and more preferably 180 sec.

EXAMPLES

Hereinafter, Examples are described. It is to be noted that the following Examples merely illustrate typical Examples of the embodiments of the present invention, and the Examples should not be construed to narrow the scope of the present invention.

In the present Examples, a concentration of components other than the solvent in a mixture (Z), a weight average molecular weight (Mw) of a hydrolytic condensation product in the mixture (Z), and an average thickness of a film were measured by the following methods.

Concentration of Components Other than Solvent in Mixture (Z)

The concentration (% by mass) was determined by: baking 0.5 g of the mixture (Z) at 250° C. for 30 min; measuring a mass of a residue thus obtained; and dividing the mass of the residue by the mass of the mixture (Z).

Weight Average Molecular Weight (Mw) of Hydrolytic Condensation Product of Mixture (Z)

Measurements were carried out by gel permeation chromatography (detector: differential refractometer) by using GPC columns ("AWA-H"×2, "AW-H"×1, and "AW2500"×2, available from Tosoh Corporation) under an analytical condition involving: a flow rate of 0.3 mL/min; an elution solvent of a mixture prepared by adding LiBr (30 mM) and citric acid (30 mM) to N,N'-dimethylacetamide; and a column temperature of 40° C., with mono-dispersed polystyrene as a standard.

Average Thickness of Film

The average thickness of the film was measured using a spectroscopic ellipsometer ("A2000D," available from J.A. Woollam Co.).

Preparation of Mixture (Z)

The compound (M), the compound (X), the solvent (B), and the solvent (C) are shown below. It is to be noted that in the following Examples, unless otherwise specified particularly, the term "parts by mass" means a value, provided that a mass of the compound (M) used was 100 parts by mass. Furthermore, "molar ratio" means a value, provided that an amount of substance of the compound (M) used was 1.

The following compounds were used as the compound (M).

M-1: tetraisopropoxy titanium(IV)
M-2: a 70% by mass solution of tetra-n-propoxy zirconium(IV) in n-propanol
M-3: cobalt(II) acetate tetrahydrate
M-4: nickel(II) acetate tetrahydrate As the compound (X), compounds (hereinafter, may be also referred to as "compounds (X-1) to (X-11)" and "compound (cx-1)") represented by the following formulae (X-1) to (X-11) and the following formula (cx-1) were used.

(X-1)

(X-2)

(X-3)

(X-4)

(X-5)

(X-6)

-continued

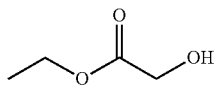
(X-7)

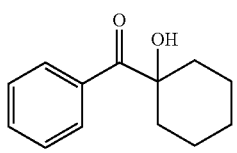
(X-8)

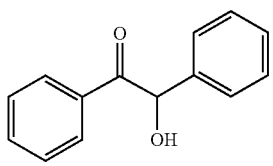
(X-9)

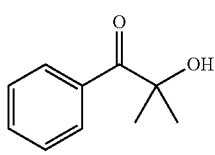
(X-10)

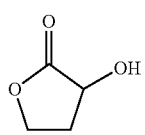
(X-11)

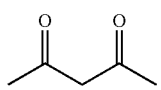
(cx-1)

As the solvent (B), the following compounds were used.
B-1: isopropanol
B-2: n-propanol
As the solvent (C), the following compound was used.
C-1: propylene glycol monoethyl ether Example 1-1: Preparation of Mixture (Z-1)

The compound (M-1) was charged into a reaction vessel in a nitrogen atmosphere. In the reaction vessel, the compound (X-1) (molar ratio: 1) was added dropwise over 30 min while stirring at room temperature (25° C. to 30° C.). Next, a reaction was permitted at 60° C. for 2 hrs. After completion of the reaction, the temperature in the reaction vessel was cooled to no greater than 30° C. A thus cooled reaction liquid was diluted with 900 parts by mass of the solvent (B-1). While stirring in the reaction vessel at room temperature (25° C. to 30° C.), water (molar ratio: 0.75) was added dropwise over 10 min. Next, a hydrolytic condensation reaction was permitted at 60° C. for 2 hrs. After completion of the hydrolytic condensation reaction, the temperature in the reaction vessel was cooled to no greater than 30° C. Into the thus cooled reaction liquid were charged 1,000 parts by mass of the solvent (C-1), and then elimination of water, isopropanol, alcohol generated by the reaction, and the excess solvent (C-1) by using an evaporator gave the mixture (Z-1). The Mw of the hydrolytic condensation product in the mixture (Z-1) was 1,700. A concentration of components other than the solvent in the mixture (Z-1) was 7.2% by mass.

Examples 1-2 to 1-14: Preparation of Mixtures (Z-2) to (Z-14)

Mixtures (Z-2) to (Z-14) were obtained by a similar operation to that of Example 1-1, except that the compound (M), the compound (X), the solvent (B), water, and the solvent (C) of the type and in the amount shown in Table 1 below were used. The Mw of the hydrolytic condensation product in the mixture (Z) and the concentration (% by mass) of the components other than the solvent in the mixture (Z) are shown together in Table 1 below.

Example 1-15: Preparation of Mixture (Z-15)

The compound (M-2) was charged into a reaction vessel in a nitrogen atmosphere. In the reaction vessel, dilution with 900 parts by mass of the solvent (B-2) was conducted while stirring at room temperature (25° C. to 30° C.). The compound (X-1) (molar ratio: 5) was added dropwise over 30 min. Next, a reaction was permitted at 80° C. for 4 hrs. After completion of the reaction, the temperature in the reaction vessel was cooled to no greater than 30° C. Into the thus cooled reaction liquid were charged 1,000 parts by mass of the solvent (C-1), and then elimination of n-propanol and the excess solvent (C-1) by using an evaporator gave the mixture (Z-15). The Mw of the metal-containing compound in the mixture (Z-15) was 600. A concentration of components other than the solvent in the mixture (Z-15) was 7.5% by mass. The Mw of the metal-containing compound in the mixture (Z) and the concentration (% by mass) of the components other than the solvent in the mixture (Z) are shown together in Table 1 below.

Examples 1-16 to 1-17: Preparation of Mixtures (Z-16) to (Z-17)

Mixtures (Z-16) to (Z-17) were obtained by a similar operation to that of Example 1-15, except that the compound (M), the compound (X), the solvent (B), and the solvent (C) of the type and in the amount shown in Table 1 below were used. The Mw of the metal-containing compound in the mixture (Z) and the concentration (% by mass) of the components other than the solvent in the mixture (Z) are shown together in Table 1 below. In Table 1 below, "–" denotes that a corresponding component was not used.

Comparative Example 1-1: Preparation of Mixture (cz-1)

A mixture (cz-1) was obtained by a similar operation to that of Example 1-1, except that the compound (M), the compound (X), the solvent (B), water, and the solvent (C) of the type and in the amount shown in Table 1 below were used. The Mw of the hydrolytic condensation product in the mixture (Z) thus obtained and the concentration (% by mass) of the compound (a) in the mixture (cz-1) are shown together in Table 1 below.

TABLE 1

| | (Z) Mixture | (M) Compound type | molar ratio | (X) Compound Type | molar ratio | (B) Solvent type | Water molar ratio | (C) Solvent Type | Mw | Concentration of components other than solvent in mixture (Z) (% by mass) |
|---|---|---|---|---|---|---|---|---|---|---|
| Example 1-1 | Z-1 | M-1 | 1 | X-1 | 1 | B-1 | 1.0 | C-1 | 1,700 | 7.2 |
| Example 1-2 | Z-2 | M-1 | 1 | X-1 | 2 | B-1 | 2.0 | C-1 | 1,500 | 7.3 |
| Example 1-3 | Z-3 | M-1 | 1 | X-1 | 5 | B-1 | 5.0 | C-1 | 1,250 | 7.5 |
| Example 1-4 | Z-4 | M-1 | 1 | X-2 | 2 | B-1 | 2.0 | C-1 | 1,400 | 7.3 |
| Example 1-5 | Z-5 | M-1 | 1 | X-3 | 2 | B-1 | 1.0 | C-1 | 1,900 | 7.2 |
| Example 1-6 | Z-6 | M-1 | 1 | X-4 | 2 | B-1 | 0.50 | C-1 | 2,100 | 7.0 |
| Example 1-7 | Z-7 | M-1 | 1 | X-5 | 2 | B-1 | 0.50 | C-1 | 1,850 | 6.9 |
| Example 1-8 | Z-8 | M-1 | 1 | X-6 | 2 | B-1 | 0.75 | C-1 | 1,900 | 7.9 |
| Example 1-9 | Z-9 | M-1 | 1 | X-7 | 2 | B-1 | 0.75 | C-1 | 1,750 | 8.0 |
| Example 1-10 | Z-10 | M-1 | 1 | X-8 | 2 | B-1 | 0.75 | C-1 | 1,600 | 7.8 |
| Example 1-11 | Z-11 | M-1 | 1 | X-9 | 2 | B-1 | 0.75 | C-1 | 1,800 | 7.7 |
| Example 1-12 | Z-12 | M-1 | 1 | X-10 | 2 | B-1 | 0.75 | C-1 | 1,550 | 7.9 |
| Example 1-13 | Z-13 | M-1 | 1 | X-11 | 2 | B-1 | 0.75 | C-1 | 1,450 | 8.0 |
| Example 1-14 | Z-14 | M-2 | 1 | X-1 | 3 | B-2 | 0.75 | C-1 | 1,800 | 7.7 |
| Example 1-15 | Z-15 | M-2 | 1 | X-1 | 5 | B-2 | — | C-1 | 600 | 7.5 |
| Example 1-16 | Z-16 | M-3 | 1 | X-1 | 3 | B-1 | — | C-1 | 600 | 7.5 |
| Example 1-17 | Z-17 | M-4 | 1 | X-1 | 3 | B-1 | — | C-1 | 600 | 7.5 |
| Comparative Example 1-1 | cz-1 | M-1 | 1 | cx-1 | 2 | B-1 | 2 | C-1 | 1,600 | 7.0 |

Preparation of Compositions

Example 2-1: Preparation of Composition (J-1)

As shown in Table 2 below, the mixture (Z) and the solvent (C) were mixed such that a content of the solvent (C-1) as the solvent (C) with respect to 1.8 parts by mass of components other than the solvent in the mixture (Z) was 98.2 parts by mass (including the solvent (C-1) contained in the mixture (Z)). The solution thus obtained was filtered through a filter having a pore size of 0.2 μm to prepare the composition (J-1).

Examples 2-2 to 2-22: Preparation of Compositions (J-2) to (J-18)

Each of compositions (J-2) to (J-22) was prepared by a similar operation to that of Example 2-1, except that the type and content of each component were as shown in Table 2 below.

Comparative Examples 2-1 to 2-2: Preparation of Compositions (j-1) to (j-2)

Each of compositions (j-1) to (j-2) was prepared by a similar operation to that of Example 2-1, except that the type and content of each component were as shown in Table 2 below.

TABLE 2

| | Composition | Components other than solvent in mixture (Z) type of mixture (Z) | content (parts by mass) | (C) Solvent type | content (parts by mass) |
|---|---|---|---|---|---|
| Example 2-1 | J-1 | Z-1 | 1.8 | C-1 | 98.2 |
| Example 2-2 | J-2 | Z-2 | 1.8 | C-1 | 98.2 |
| Example 2-3 | J-3 | Z-3 | 1.8 | C-1 | 98.2 |
| Example 2-4 | J-4 | Z-4 | 1.8 | C-1 | 98.2 |
| Example 2-5 | J-5 | Z-5 | 1.8 | C-1 | 98.2 |
| Example 2-6 | J-6 | Z-6 | 1.8 | C-1 | 98.2 |
| Example 2-7 | J-7 | Z-7 | 1.8 | C-1 | 98.2 |
| Example 2-8 | J-8 | Z-8 | 1.8 | C-1 | 98.2 |
| Example 2-9 | J-9 | Z-9 | 1.8 | C-1 | 98.2 |
| Example 2-10 | J-10 | Z-10 | 1.8 | C-1 | 98.2 |
| Example 2-11 | J-11 | Z-11 | 1.8 | C-1 | 98.2 |
| Example 2-12 | J-12 | Z-12 | 1.8 | C-1 | 98.2 |
| Example 2-13 | J-13 | Z-13 | 1.8 | C-1 | 98.2 |
| Example 2-14 | J-14 | Z-14 | 1.8 | C-1 | 98.2 |
| Example 2-15 | J-15 | Z-15 | 1.8 | C-1 | 98.2 |
| Example 2-16 | J-16 | Z-16 | 1.8 | C-1 | 98.2 |
| Example 2-17 | J-17 | Z-17 | 1.8 | C-1 | 98.2 |
| Example 2-18 | J-18 | Z-1 | 7.0 | C-1 | 98.2 |
| Example 2-19 | J-19 | Z-2 | 7.0 | C-1 | 98.2 |
| Example 2-20 | J-20 | Z-3 | 7.0 | C-1 | 98.2 |
| Example 2-21 | J-21 | Z-4 | 7.0 | C-1 | 98.2 |
| Example 2-22 | J-22 | Z-5 | 7.0 | C-1 | 98.2 |
| Comparative Example 2-1 | j-1 | cz-1 | 1.8 | C-1 | 98.2 |
| Comparative Example 2-2 | j-2 | cz-1 | 7.0 | C-1 | 93.0 |

Comparative Example 2-3: Preparation of Composition (j-3)

1.61 g of oxalic acid was dissolved in 96.45 g of water with heating to prepare an aqueous oxalic acid solution. Thereafter, a flask charged with 25.70 g (70 mol %) of tetramethoxysilane, 9.86 g (30 mol %) of methyltrimethoxysilane, and 366.39 g of propylene glycol monoethyl ether was fitted with a cooling tube and a dropping funnel containing the aqueous oxalic acid solution thus prepared. Next, after heating the mixture to 60° C. on an oil bath, the aqueous oxalic acid solution was slowly added dropwise to the mixture, and a reaction of the mixture was permitted at 60° C. for 4 hours. After completion of the reaction, the flask containing the reaction solution was allowed to cool, and then fitted with an evaporator. The reaction solution was then concentrated in vacuo to give 360 g of a polysiloxane solution. A concentration of components other than the solvent in the polysiloxane solution thus obtained was 9.8% by mass. The weight average molecular weight (Mw) of the polysiloxane thus obtained was 1,500. The polysiloxane solution was mixed with propylene glycol monoethyl ether to adjust the concentration of the components other than the solvent in the polysiloxane solution to be 1.8% by mass, thereby preparing the composition (j-3).

Evaluations

In accordance with the following procedures, each of the compositions prepared as above was evaluated on the storage stability, the coating-film-thickness-variation-inhibiting property, resistance to etching by an oxygen-based gas (may be also referred to as "oxygen-based-gas etching resistance"), the embedding property, removability, the resist pattern collapse-inhibiting property, and the solubility in an organic solvent. The evaluation results are shown together in Table 3 and Table 4 below. In Table 3 below, "–" denotes that a corresponding evaluation was not performed.

Storage Stability

Each of the compositions immediately after preparation (T=0) as described above was applied on a silicon wafer (substrate) with a spin coater ("CLEAN TRACK ACT 8," available from Tokyo Electron Limited) by way of a spin-coating procedure under a condition involving 1,500 rpm and 30 sec, followed by heating a thus resulting coating film at 90° C. for 60 sec to form a metal-containing film. With regard to the storage stability in connection with the coating characteristics, each of the metal-containing films thus formed was observed with an optical microscope, and evaluated to be: "A" (favorable) in a case of finding no coating unevenness; and "B" (unfavorable)" in a case of finding coating unevenness. Furthermore, each composition, having been evaluated on the coating characteristics, was stored at 20° C. for 60 days (T=60) and then similarly subjected to a coating characteristics evaluation, and evaluated similarly.

Coating-Film-Thickness-Variation-Inhibiting Property

A metal-containing film was formed by: applying the composition prepared as described above on a silicon wafer with the spin coater by way of a spin-coating procedure under a condition involving 1,500 rpm and 30 sec, followed by heating at 250° C. for 60 sec after passage of a predetermined time period and cooling at 23° C. for 30 sec. As the metal-containing film, each of a "metal-containing film (a0)," in a case in which the predetermined time period was 30 sec, and a "metal-containing film (a1)," in a case in which the predetermined time period was 300 sec, was formed; an average thickness of the metal-containing film (a0) was considered to be T0 and an average thickness of the metal-containing film (a1) was considered to be T1, and a film-thickness-variation percentage (%) was determined by the following formula, being used as a marker for the coating-film-thickness-variation-inhibiting property.

Film-Thickness-Variation Percentage (%)=|T1−T0|× 100/T0

The coating-film-thickness-variation-inhibiting property was evaluated to be: "A" (favorable) in a case in which the film-thickness-variation percentage was less than 1.7%; and "B" (unfavorable) in a case in which the film-thickness-variation-inhibiting percentage was no less than 1.7%.

Oxygen-Based-Gas Etching Resistance

A metal-containing film having an average thickness of 30 nm was formed by: applying the composition prepared as described above on a silicon wafer with the spin coater by way of a spin-coating procedure, followed by heating at 220° C. for 60 sec and cooling at 23° C. for 30 sec.

The substrate on which the metal-containing film was formed was subjected to an etching treatment by using an etching apparatus ("Tactras-Vigus" available from Tokyo Electron Limited), under conditions involving $O_2$=400 sccm, PRESS.=25 mT, HF RF (radiofrequency power for plasma production)=200 W, LF RF (radiofrequency power for bias)=0 W, DCS=0 V, RDC (flow rate percentage at gas center)=50%, for 60 sec. An etching rate (nm/min) was calculated based on the average film thickness of the silicon-containing film before the treatment and the average film thickness of the silicon-containing film after the treatment, and the oxygen-based-gas etching resistance was evaluated. The etching resistance was evaluated to be: "A" (favorable) in a case in which the etching rate was less than 1.0 nm/min; and "B" (unfavorable) in a case in which the etching rate was no less than 1.0 nm/min.

Embedding Property

On a silicon nitride substrate having a trench pattern with a depth of 300 nm and a width of 30 nm formed thereon, the composition prepared as described above was applied with the spin coater by way of a spin-coating procedure. A rotational speed for the spin coating was the same as that in the case of forming the film having the average thickness of 30 nm on the silicon wafer in the evaluation of the "Oxygen-Based-Gas Etching Resistance," described above. Next, heating was carried out in an ambient atmosphere at 250° C. for 60 sec, followed by cooling at 23° C. for 30 sec to obtain the substrate having a metal-containing film formed thereon. The presence/absence of poor embedding property (void) was confirmed on a cross-section of the substrate thus obtained by using a field emission scanning electron microscope ("CG-4000," available from Hitachi High-Technologies Corporation). The embedding property was evaluated to be: "A" (favorable) in a case of no embedding defect being observed; and "B" (unfavorable) in a case of the defect being observed.

Removability

Formation of Metal-Containing-Film-Attached Substrate

A metal-containing-film-attached substrate was made by: applying the composition prepared as described above on a silicon wafer with the spin coater by way of a spin-coating procedure, followed by heating at 220° C. for 60 sec and cooling at 23° C. for 30 sec to form the film with an average thickness of 30 nm.

Removal of Metal-Containing Film

Each metal-containing-film-attached substrate made as described above was processed by film removal conditions described below. The surface of each film-attached substrate was brought into contact with a removing liquid indicated in Table 3 below by way of a puddle procedure, and then dried by spinning with the spin coater.

Film Removal Condition 1

Each metal-containing-film-attached substrate obtained as described above was immersed for 5 min in a removing liquid (R-1) (mixed aqueous solution; 25% by mass aqueous ammonia solution/30% by mass hydrogen peroxide solution/water=1/1/5 (volume ratio)) having been heated to 65° C.

Film Removal Condition 2

Each metal-containing-film-attached substrate obtained as described above was immersed for 5 min in a removing liquid (R-2) (mixed aqueous solution; 96% by mass sulfuric acid/30% by mass hydrogen peroxide solution=3/1 (volume ratio)) having been heated to 50° C.

Film Removal Condition 3

Each metal-containing-film-attached substrate obtained as described above was immersed for 5 min in a removing liquid (R-3) (85% by mass aqueous phosphoric acid solution) having been heated to 50° C.

Evaluation

Each metal-containing-film-attached substrate which had been subjected to the treatment under the metal removal condition shown above was observed with cross-sectional SEM, and was evaluated to be: "A" (favorable) in a case in which the metal-containing film did not remain; and "B" (unfavorable) in a case in which the metal-containing film remained.

Resist Pattern Collapse-Inhibiting Property

An organic underlayer film having an average thickness of 100 nm was formed on a silicon wafer by applying a material for forming an organic underlayer film ("HM8006", available from JSR Corporation) by spin coating with the spin coater, and then heating at 250° C. for 60 sec. A metal-containing film having an average thickness of 13 nm was formed by applying the composition prepared as described above, onto the organic underlayer film and heating at 220° C. for 60 sec, followed by cooling at 23° C. for 30 sec.

Subsequently, a resist film having an average thickness of 50 nm was formed by applying a radiation-sensitive resin composition described later onto the metal-containing film thus formed, and heating at 130° C. for 60 sec, followed by cooling at 23° C. for 30 sec.

The radiation-sensitive resin composition was obtained by mixing: 100 parts by mass of a polymer having a structural unit (1) derived from 4-hydroxystyrene, a structural unit (2) derived from styrene, and a structural unit (3) derived from 4-t-butoxystyrene (proportion of each structural unit contained: (1)/(2)/(3)=65/5/30 (mol %)); 2.5 parts by mass of triphenylsulfonium salicylate as a radiation-sensitive acid generating agent; and as solvents, 1,500 parts by mass of ethyl lactate and 700 parts by mass of propylene glycol monomethyl ether acetate, and filtering the resulting solution through a filter having a pore size of 0.2 μm.

The resist film was exposed by using an EUV scanner ("TWINSCAN NXE: 3300B", available from ASML (NA: 0.3, Sigma: 0.9, quadrupole illumination, mask of a 1:1 line-and-space pattern with a line width of 25 nm in terms of dimension on the wafer)). After the exposure, the substrate was heated at 110° C. for 60 sec, and then cooled at 23° C. for 60 sec. Thereafter, a 2.38% by mass aqueous TMAH solution (20 to 25° C.) was used to carry out a development according to a puddle procedure. Subsequently, washing with water, followed by drying, gave a resist-patterned substrate for evaluation. In the resist pattern formation, an exposure dose at which a 1:1 line-and-space pattern was formed with a line width of 25 nm was defined as an "optimal exposure dose". For a line-width measurement and inspection of the resist pattern of the substrate for evaluation, a scanning electron microscope ("CG-4000" available from Hitachi High-Technologies Corporation) was employed. The collapse-inhibiting property was evaluated, at the optimum exposure dose, as: "A" (favorable) in a case in which the pattern collapse was not observed; and "B" (unfavorable) in a case in which the pattern collapse was observed.

TABLE 3

| | | Storage stability | | Coating-film-thickness-variation-inhibiting property | Oxygen-based-gas etching resistance | Embedding property | Removability | | | Resist pattern collapse-inhibiting property |
|---|---|---|---|---|---|---|---|---|---|---|
| | Composition | T = 0 | T = 60 | | | | removing liquid R-1 | removing liquid R-2 | removing liquid R-3 | |
| Example 2-1 | J-1 | A | A | A | A | A | A | A | A | A |
| Example 2-2 | J-2 | A | A | A | A | A | A | A | A | A |
| Example 2-3 | J-3 | A | A | A | A | A | A | A | A | A |
| Example 2-4 | J-4 | A | A | A | A | A | A | A | A | A |
| Example 2-5 | J-5 | A | A | A | A | A | A | A | A | A |
| Example 2-6 | J-6 | A | A | A | A | A | A | A | A | A |
| Example 2-7 | J-7 | A | A | A | A | A | A | A | A | A |
| Example 2-8 | J-8 | A | A | A | A | A | A | A | A | A |
| Example 2-9 | J-9 | A | A | A | A | A | A | A | A | A |
| Example 2-10 | J-10 | A | A | A | A | A | A | A | A | A |
| Example 2-11 | J-11 | A | A | A | A | A | A | A | A | A |
| Example 2-12 | J-12 | A | A | A | A | A | A | A | A | A |
| Example 2-13 | J-13 | A | A | A | A | A | A | A | A | A |
| Example 2-14 | J-14 | A | A | A | A | A | A | A | A | A |
| Example 2-15 | J-15 | A | A | A | A | A | A | A | A | A |
| Example 2-16 | J-16 | A | A | A | A | A | — | — | — | — |
| Example 2-17 | J-17 | A | A | A | A | A | — | — | — | — |
| Comparative Example 2-1 | j-1 | A | B | B | A | B | A | A | A | A |
| Comparative Example 2-2 | j-2 | A | B | B | B | A | B | B | B | B |

Solubility in Organic Solvent

After a silicon wafer was spin-coated with the composition prepared as described above, by using the spin coater at 1,500 rpm for 30 sec, an edge-back rinse step was carried out by spraying an organic solvent (propylene glycol monomethyl ether/propylene glycol monomethyl ether acetate=70/30, volume ratio) from a nozzle situated at a position 5 mm away from the edge of the silicon wafer under a condition involving 10 mL/min and 25° C. at 1,500 rpm for 30 sec, followed by spinning at 1,500 rpm for 10 sec. The surface of the silicon wafer was visually observed at a position 5 mm away from the edge, and evaluated to be: "A" (favorable) in a case in which no residue of the metal-containing film was found; and "B" (unfavorable) in a case in which a residue of the metal-containing film was found. The evaluation results are shown in Table 4 below.

TABLE 4

|  | Composition | Solubility in organic solvent |
|---|---|---|
| Example 2-18 | J-18 | A |
| Example 2-19 | J-19 | A |
| Example 2-20 | J-20 | A |
| Example 2-21 | J-21 | A |
| Example 2-22 | J-22 | A |
| Comparative Example 2-3 | j-3 | B |

From the results shown in Table 3 and Table 4 above, the compositions of the Examples are revealed to be superior in the storage stability. Furthermore, the films formed by using the compositions of the Examples are revealed to be superior in the coating-film-thickness-variation-inhibiting property, the oxygen-based-gas etching resistance, the embedding property, the removability and the resist pattern collapse-inhibiting property, and the solubility in an organic solvent.

According to the present invention, a composition being superior in storage stability and an embedding property, a film, a method of forming a film, a method of forming a pattern, a method of forming an organic-underlayer-film reverse pattern, and a method of producing a composition can be provided.

Obviously, numerous modifications and variations of the present invention are possible in light of the above teachings. It is therefore to be understood that within the scope of the appended claims, the invention may be practiced otherwise than as specifically described herein.

What is claimed is:

1. A composition comprising:
a metal compound comprising a ligand; and
a solvent,
wherein the ligand is derived from a compound represented by formula (1):

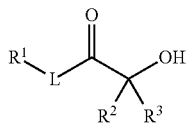

(1)

wherein, in the formula (1), L represents a single bond; $R^1$ represents a substituted or unsubstituted monovalent hydrocarbon group having 1 to 10 carbon atoms; $R^2$ and $R^3$ each independently represent a hydrogen atom or a substituted or unsubstituted monovalent hydrocarbon group having 1 to 10 carbon atoms, or $R^2$ and $R^3$ bind with each other and represent an alicyclic structure having 3 to 20 ring atoms together with the carbon atom to which $R^2$ and $R^3$ bond, or $R^1$ and either $R^2$ or $R^3$ bind with each other and represent a lactone ring structure having 4 to 20 ring atoms or a cyclic ketone structure having 4 to 20 ring atoms together with the atom chain to which $R^1$ and either $R^2$ or $R^3$ bond.

2. The composition according to claim 1, wherein a metal atom in the metal compound belongs to period 3 to period 7 of group 2 to group 14 in periodic table.

3. The composition according to claim 2, wherein the metal atom belongs to group 4, group 9, or group 10 in the periodic table.

4. The composition according to claim 1, wherein $R^1$ represents a substituted or unsubstituted monovalent chain hydrocarbon group having 1 to 10 carbon atoms.

5. The composition according to claim 1, wherein $R^2$ and $R^3$ each represent a hydrogen atom.

6. A film formed from the composition according to claim 1.

7. A method of forming a film, the method comprising applying the composition according to claim 1 directly or indirectly on a substrate.

8. A method of forming a pattern, the method comprising:
applying the composition according to claim 1 directly or indirectly on a substrate to form a resist underlayer film;
applying an organic-resist-film-forming composition directly or indirectly on the resist underlayer film to form an organic resist film;
exposing the organic resist film to a radioactive ray; and
developing the organic resist film exposed.

9. A method of forming an organic-underlayer-film reverse pattern, the method comprising:
forming an organic underlayer film directly or indirectly on a substrate;
forming a resist pattern directly or indirectly on the organic underlayer film;
forming an organic-underlayer-film pattern by etching the organic underlayer using the resist pattern as a mask;
forming an organic-underlayer-film-reverse-pattern-forming film on the organic-underlayer-film pattern by applying the composition according to claim 1; and
removing the organic-underlayer-film pattern to form an organic-underlayer-film reverse pattern.

10. A method of producing the composition according to claim 1, the method comprising:
mixing a metal alkoxide and a compound represented by formula (1) to obtain a mixture;
adding water to the mixture to cause a hydrolytic condensation reaction of the metal alkoxide; and
adding a solvent to the mixture to which the water is added:

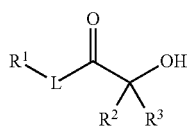

(1)

wherein, in the formula (1), L represents a single bond; $R^1$ represents a substituted or unsubstituted monovalent hydrocarbon group having 1 to 10 carbon atoms; $R^2$ and $R^3$ each independently represent a hydrogen atom or a substituted or unsubstituted monovalent hydrocarbon group having 1 to 10 carbon atoms, or $R^2$ and $R^3$ bind with each other and represent an alicyclic structure having 3 to 20 ring atoms together with the carbon atom to which $R^2$ and $R^3$ bond, or $R^1$ and either $R^2$ or $R^3$ bind with each other and represent a lactone ring structure having 4 to 20 ring atoms or a cyclic ketone structure having 4 to 20 ring atoms together with the atom chain to which $R^1$ and either $R^2$ or $R^3$ bond.

11. A composition comprising:
a metal compound comprising a ligand; and
a solvent,
wherein the ligand is derived from a compound represented by formula (1):

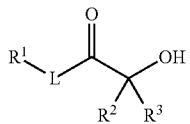

wherein, in the formula (1), L represents an oxygen atom or a single bond; $R^1$ represents a substituted or unsubstituted monovalent hydrocarbon group having 1 to 10 carbon atoms; $R^2$ and $R^3$ each represent a hydrogen atom.

12. The composition according to claim 11, wherein a metal atom in the metal compound belongs to period 3 to period 7 of group 2 to group 14 in periodic table.

13. The composition according to claim 12, wherein the metal atom belongs to group 4, group 9, or group 10 in the periodic table.

14. The composition according to claim 11, wherein $R^1$ represents a substituted or unsubstituted monovalent chain hydrocarbon group having 1 to 10 carbon atoms.

15. A film formed from the composition according to claim 11.

16. A method of forming a film, the method comprising applying the composition according to claim 11 directly or indirectly on a substrate.

17. A method of forming a pattern, the method comprising:
applying the composition according to claim 11 directly or indirectly on a substrate to form a resist underlayer film;
applying an organic-resist-film-forming composition directly or indirectly on the resist underlayer film to form an organic resist film;
exposing the organic resist film to a radioactive ray; and
developing the organic resist film exposed.

18. A method of forming an organic-underlayer-film reverse pattern, the method comprising:
forming an organic underlayer film directly or indirectly on a substrate;
forming a resist pattern directly or indirectly on the organic underlayer film;
forming an organic-underlayer-film pattern by etching the organic underlayer using the resist pattern as a mask;
forming an organic-underlayer-film-reverse-pattern-forming film on the organic-underlayer-film pattern by applying the composition according to claim 11; and
removing the organic-underlayer-film pattern to form an organic-underlayer-film reverse pattern.

19. A method of producing the composition according to claim 11, the method comprising:
mixing a metal alkoxide and a compound represented by formula (1) to obtain a mixture;
adding water to the mixture to cause a hydrolytic condensation reaction of the metal alkoxide; and
adding a solvent to the mixture to which the water is added:

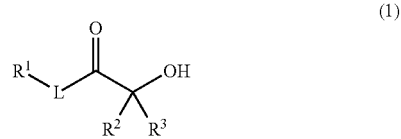

wherein, in the formula (1), L represents an oxygen atom or a single bond; $R^1$ represents a substituted or unsubstituted monovalent hydrocarbon group having 1 to 10 carbon atoms; $R^2$ and $R^3$ each independently represent a hydrogen atom.

* * * * *